(12) United States Patent
Schulze et al.

(10) Patent No.: US 8,343,862 B2
(45) Date of Patent: Jan. 1, 2013

(54) SEMICONDUCTOR DEVICE WITH A FIELD STOP ZONE AND PROCESS OF PRODUCING THE SAME

(75) Inventors: Hans-Joachim Schulze, Ottobrunn (DE); Frank Pfirsch, Munich (DE); Stephan Voss, Munich (DE); Franz-Josef Niedernostheide, Muenster (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/103,784

(22) Filed: May 9, 2011

(65) Prior Publication Data

US 2011/0207310 A1     Aug. 25, 2011

Related U.S. Application Data

(62) Division of application No. 11/468,846, filed on Aug. 31, 2006, now Pat. No. 7,989,888.

(51) Int. Cl.
    *H01L 21/425* (2006.01)
(52) U.S. Cl. ........ 438/527; 438/528; 438/530; 257/335; 257/E29.027
(58) Field of Classification Search .......... 438/527–528, 438/530; 257/335
    See application file for complete search history.

(56) References Cited

U.S. PATENT DOCUMENTS

| 4,181,538 | A | * | 1/1980 | Narayan et al. | 438/473 |
| 4,379,727 | A | * | 4/1983 | Hansen et al. | 438/530 |
| 7,361,970 | B2 | | 4/2008 | Barthelmess et al. | |
| 7,514,750 | B2 | | 4/2009 | Mauder et al. | |
| 2004/0084724 | A1 | * | 5/2004 | Kapels et al. | 257/330 |
| 2006/0081923 | A1 | * | 4/2006 | Mauder et al. | 257/335 |
| 2008/0054369 | A1 | | 3/2008 | Schulze et al. | |
| 2008/0283868 | A1 | | 11/2008 | Schulze et al. | |

OTHER PUBLICATIONS

"U.S. Appl. No. 11/468,846 Non-Final Office Action mailed Sep. 28, 2010", 9 pgs.
"U.S. Appl. No. 11/468,846, Advisory Action mailed Apr. 30, 2010", 3 pgs.
"U.S. Appl. No. 11/468,846, Non-Final Office Action mailed Feb. 4, 2010", 9 pgs.
"U.S. Appl. No. 11/468,846, Non-Final Office Action mailed Aug. 7, 2009", 10 pgs.
"U.S. Appl. No. 11/468,846, Notice of Allowance mailed Mar. 25, 2011", 8 pgs.
"U.S. Appl. No. 11/468,846, Notice of Publication received Mar. 14, 2008", 1 pg.
"U.S. Appl. No. 11/468,846, Response filed Apr. 5, 2010 to Non Final Office Action", 10 pgs.
"U.S. Appl. No. 11/468,846, Response filed Nov. 5, 2009 to Non Final Office Action mailed Aug. 7, 2009", 10 pgs.
"U.S. Appl. No. 11/468,846, Response filed Dec. 28, 2010 to Non Final Office Action mailed Sep. 28, 2010", 9 pgs.
"U.S. Appl. No. 11/468,846, Response filed Jun. 12, 2009 to Restriction Requirement mailed Mar. 17, 2009", 5 pgs.
"U.S. Appl. No. 11/468,846, Restriction Requirement filed Mar. 17, 2009", 3 pgs.

* cited by examiner

*Primary Examiner* — Kenneth Parker
*Assistant Examiner* — Jose R Diaz
(74) *Attorney, Agent, or Firm* — Schwegman, Lundberg & Woessner, P.A.

(57) ABSTRACT

Embodiments discussed herein relate to processes of producing a field stop zone within a semiconductor substrate by implanting dopant atoms into the substrate to form a field stop zone between a channel region and a surface of the substrate, at least some of the dopant atoms having energy levels of at least 0.15 eV below the energy level of the conduction band edge of semiconductor substrate; and laser annealing the field stop zone.

18 Claims, 4 Drawing Sheets

US 8,343,862 B2

SEMICONDUCTOR DEVICE WITH A FIELD STOP ZONE AND PROCESS OF PRODUCING THE SAME

CLAIM OF PRIORITY

This application is a divisional of and claims the benefit of priority under 35 U.S.C. §120 to U.S. patent application Ser. No. 11/468,846, entitled "SEMICONDUCTOR DEVICE WITH A FIELD STOP ZONE AND PROCESS OF PRODUCING THE SAME," filed on Aug. 31, 2006, which is hereby incorporated by reference herein in its entirety.

TECHNICAL FIELD

The subject matter disclosed herein generally relates to the semiconductor devices and processes for making them, and more specifically, to an insulated gate bipolar transistors, IGBTs, with field stop zones.

BACKGROUND INFORMATION

IGBTs have been made as punch-through devices (PT-IGBT) in which a DMOS type structure is formed at the top of an epitaxially deposited silicon substrate. The epitaxial layer is formed atop a higher concentration buffer layer, of the same conductivity type, which is in turn formed on a substrate of opposite conductivity type and which acts as a minority carrier injection source. In such punch-through devices, the electric field across the silicon substrate under reverse bias reaches from the top surface of the silicon to the buffer layer, which also acts as a depletion layer stop.

Field stop IGBTs, on the other hand, are made starting from a low doped substrate of a first conductivity type without employing epitaxial layers. The field stop zone has considerably lower doping concentration than the buffer layer in a PT-IGBT.

The field stop zone plays a key role in the operational properties of IGBTs. In particular, thickness and concentration of the field stop zone greatly affect the switching and breakdown voltage characteristics of the device.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In the following description, the terms "wafer" and "substrate" may be used interchangeably to refer generally to any structure on which integrated circuits are formed and also to such structures during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "conductor" is understood to generally include n-type and p-type semiconductors and the term "insulator" or "dielectric" is defined to include any material that is less electrically conductive than the materials referred to as "conductors." The following detailed description is, therefore, not to be taken in a limiting sense.

Figure 1:
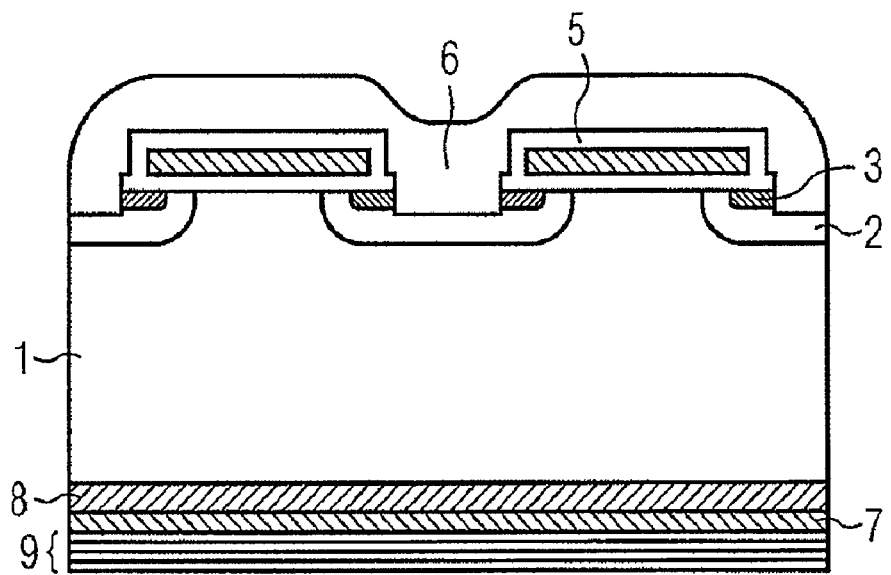
FIG. 1 illustrates a cross-sectional view of a few cells of a conventional IGBT showing a field stop zone that is located adjacent to the collector electrode.
Figure 2:
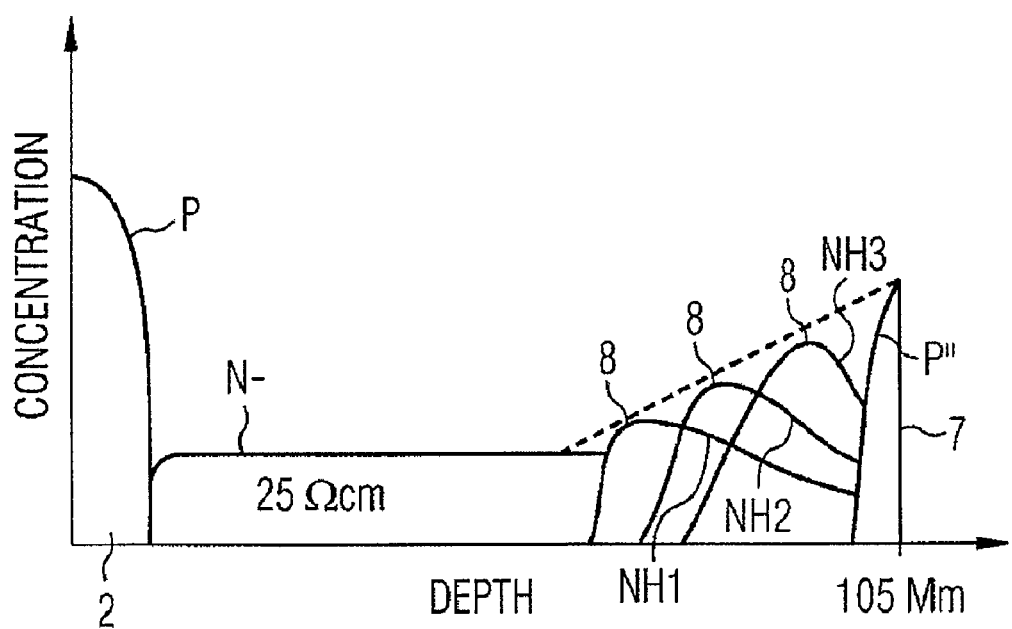
FIG. 2 illustrates an example of a dopant profile of the IGBT shown in FIG. 1.

The conventional IGBT and its dopant profile as mentioned further above is shown in FIG. 1 and FIG. 2, respectively.

FIG. 1 illustrates a partial cross-sectional view of cells of a conventional IGBT comprising a thin semiconductor substrate 1, a base region 2 embedded in a top main surface of said substrate 1, and a source region 3 formed within said base region 2. A gate 4 that is embedded in an insulating silicon oxide layer 5 is formed atop said base and source region 2 and 3, respectively. An electrode 6 is formed over said top main surface of said substrate 1 contacting said base and source region 2 and 3, respectively. A p$^+$-region 7 is formed in said substrate 1 adjacent to a bottom main surface, and a field stop zone 8 is formed in said substrate 1 adjacent to said p$^+$-region. A collector electrode 9 is formed atop said bottom main surface of said substrate 1. The collector electrode 9 may consist of a plurality of different conducting layers.

FIG. 2 illustrates an example of a dopant profile of the IGBT described above and, in particular, of the field stop zone 8. Here, said field stop zone 8 comprises a plurality of sequential implants (NH3, NH2, NH1) that function as a buffer layer.

Conventionally, a field stop zone is formed within a substrate by thinning the substrate to a precise thickness, implanting an n-type dopant such as phosphorus or arsenic into the bottom surface of the substrate, followed by high temperature anneal (usually greater than about 800° C.) to activate the dopant. It is also known to use multiple proton implantations in order to produce a field stop zone. In such processes, hydrogen is implanted into a predetermined depth of the substrate, where the hydrogen atoms function as n-dopants in combination with the implant damage.

Figure 3:
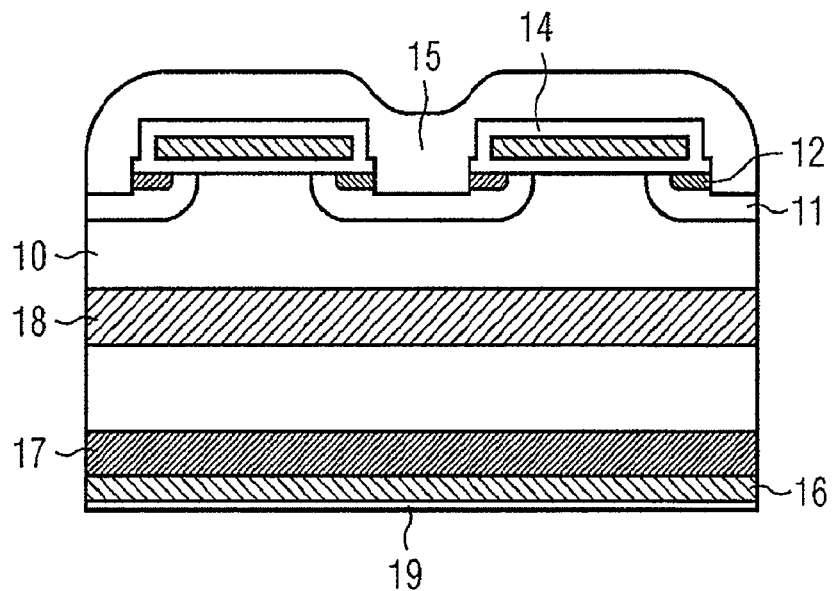
FIG. 3 illustrates a cross-sectional view of an embodiment of the invention comprising a first field stop zone adjacent to the p$^+$-zone and single further or second field stop zone.

FIG. 3 illustrates some embodiments of an IGBT comprising a thin semiconductor substrate 10, a base region 11 embedded in a top surface of said substrate 10 and a source region 12 formed within said base region 11. A gate 13 that is embedded in an insulating silicon oxide layer 14 is formed atop said base and source regions 11 and 12, respectively. An electrode 15 is then formed over said top surface of said substrate 10 contacting said base- and source regions 11 and 12, respectively. A p-doped zone 16 is formed in said substrate 10 adjacent to a bottom surface and a first field stop zone 17 of deep is formed of deep donor dopants in said substrate 10 adjacent to said p-emitter 16. A second field stop zone 18 is formed between said first field stop zone 17 and said top surface of said substrate 10. A metal electrode 19 is formed atop said bottom main surface of said substrate 10.

Here, in some embodiments, the first field stop zone 17 is produced by implanting selenium atoms through said bottom main surface of said substrate 10 and annealing said selenium atoms using laser annealing means. Small particles lying on the surface during selenium implantation are irrelevant to causing potential defects in the first field stop zone 17, because the laser-annealing process ensures sufficient lateral diffusion of the selenium atoms resulting in an undamaged first field stop zone 17 and with it in low leakage currents.

In some embodiments, various other deep donor dopant atom types such as sulphur atoms having energy levels of at least 0.15 eV below the energy level of the conduction band edge of the semiconductor substrate 10. In some embodiments, for a silicon substrate, sulfur atoms in particular, can be used instead of selenium atoms.

Moreover, selenium atoms constitute deep donors within the silicon substrate 10 and are not electrically activated within the space-charge region until a specific time period passed, enabling the space-charge region to respond much faster to short circuits than the conventional field stop zones produced by diffusion of implanted phosphorus or proton implantation. Thus, holes can be injected fast from the p-doped emitter 16 to compensate for the change of the electric field caused by a potential short circuit.

The reasons mentioned above are also responsible for the faster switch-on speed of the IGBT. A second field stop zone 18, produced by means of proton implantation and subsequent thermal annealing at temperatures equal or less than 420° C., further promotes soft switching properties of the IGBT.

In some embodiments, the field stop zone closest to the back surface of the substrate is formed in such that its main dopant peak is located as close to the p-emitter zone of the IGBT as possible, in order to ensure sufficient short circuit withstandability.

In an embodiment of the invention, the dopant atoms additionally comprise a second type of dopant atoms, e.g. atoms acting as shallow donor impurities. Such atoms, which may be phosphorus or, alternatively, arsenic atoms, in combination with the selenium or sulphur atoms result in an approximately temperature-independent switching characteristics of a semiconductor device formed in the semiconductor substrate. In particular, in such semiconductor device a reasonable balance between softness of the turn-off characteristics and switching losses across the whole operating temperature range of the device may be obtained. To achieve this, the ratio between the dopant doses of both types of atoms is suitably controlled. In some embodiments, the ratio is in the range between about 0.15 and about 0.8. In some embodiments, the ratio is between about 0.3 and about 0.7.

In some embodiments using a thin semiconductor substrates (having a thickness of e.g. 200 μm or below), laser annealing means for annealing the implantation zone are used. In other embodiments, using a relatively thick semiconductor substrate (e.g. above 200 μm), a thermal annealing is used. In some embodiments, combining selenium or sulphur dopant atoms on the one hand with phosphorus or arsenic dopant atoms on the other, for annealing either type of dopant atoms, annealing using a laser is performed.

The p-doped zone 16 can be produced by implantation of boron atoms in combination with a second laser-annealing step. The laser power of the second laser annealing step should, however, be lower than the power used for producing said first field stop zone 17 in order to prevent boron atoms to be deposited deeply within the silicon substrate 10. Alternatively, the p-doped zone 16 produced by implanted boron atoms can also be activated sufficiently by a conventional thermal annealing step at temperatures below 420° C.

The laser-annealing step results in an approximately rectangular boron or selenium atom concentration profile, also characterized as "box" profile. Here, the maximum achievable dopant concentration is determined by the solubility of the respective elements in the molten silicon. In some embodiments, a maximum dopant concentration need not be reached because a dopant dose that is greater than $5 \times 10^{11}$ $cm^{-2}$, more specifically greater than $2 \times 10^{12}$ $cm^{-2}$, for the field stop zone 17, located adjacent to the p-doped zone 16, is sufficient.

The penetration depth of the field stop zone 17 is determined by the laser energy during the laser-annealing step. In some embodiments, depths are in the range of less than 1 μm. In some embodiments, depths are in the range of less than 0.5 μm. In some embodiments, the field stop zone closest to the back surface of the substrate should be formed in such a way that its main dopant peak is located as close to the p-emitter zone of the IGBT as possible in order to ensure sufficient short circuit withstandability.

A embodiments of the present invention include the combination of a dopant atom field stop, wherein at least part of the dopant atoms are atoms with an energy level that is at least 0.15 eV below the energy level of the conduction band edge of the semiconductor, whereby these atoms are activated by laser annealing, and—in some embodiments—a proton induced field stop within a semiconductor device e.g. an IGBT or a diode. The resulting higher degree of freedom allows adjusting the short circuit withstandability, the switch-on properties and the softness of the switch-off properties of the IGBT. It also minimizes IGBT leakage current.

In some embodiments, the field stop zone is at least partly defined by implanted selenium atoms. The advantage of using selenium atoms is that they constitute deep donors with an energy level at least 0.15 eV below the energy level of the conduction band edge within a silicon semiconductor substrate, and are only fully activated electrically within the space-charge region after a specific time delay. In such embodiments, the space-charge region response to any short circuit situations is faster.

In some embodiments, the field stop zone is at least partly defined by implanted sulphur atoms. The advantage of using sulphur atoms is that they have an energy level that is at least 0.15 eV below the energy level of the conduction band edge of the semiconductor substrate providing properties that are similar to selenium atoms.

In some embodiments, the dopant dose of said field stop zone is at least $5 \times 10^{11}$ $cm^{-2}$, preferably $2 \times 10^{12}$ $cm^{-2}$ or more. The laser annealing process leads to the formation of an approximately rectangular concentration profile of said selenium or sulphur atoms within the semiconductor substrate and enables a much higher activation degree of the implanted Se or S atoms compared to a conventional activation or diffusion process performed in furnaces.

Furthermore, the depth of penetration of said field stop zone is less than 1 μm with respect to the second main surface of said semiconductor ensuring a sufficient short circuit withstandability of the semiconductor.

In other embodiments of the present invention, the thermal annealing of the second field stop zone is carried out at a temperature that is equal to or less than 420° C. in order to activate the implanted protons of said second field stop zone and, in some embodiments, the boron atoms of the emitter zone without causing a significantly increased depth of penetration within the semiconductor substrate and reducing any possibility of damage to metal contacts.

Figure 4:
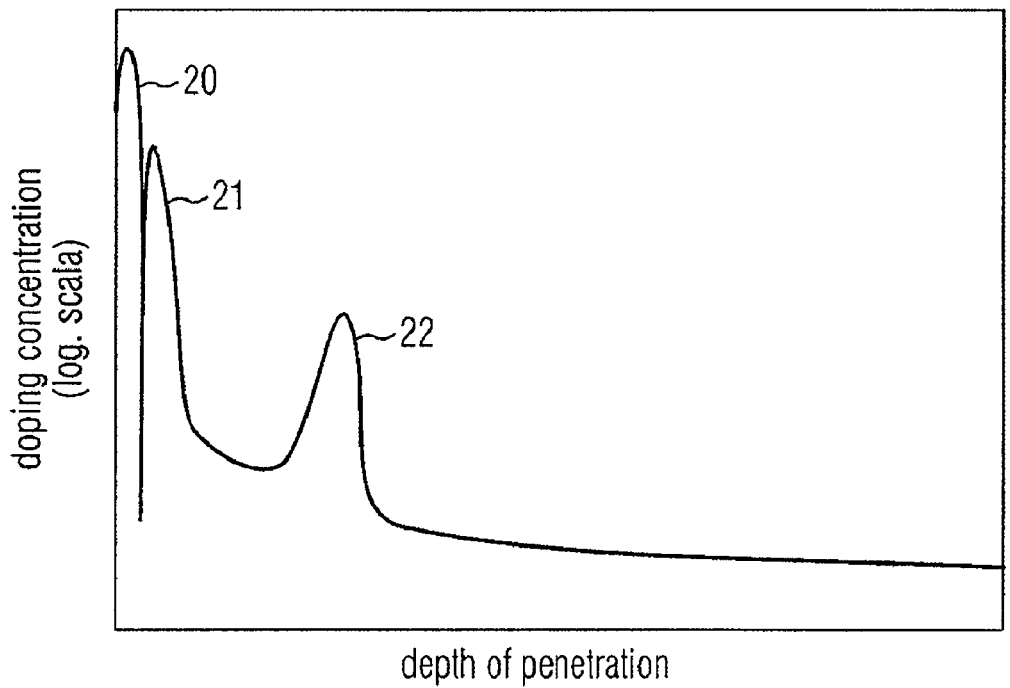
FIG. 4 illustrates an example of a dopant profile of the IGBT embodiments shown in FIG. 3.

FIG. 4 shows an example of some embodiments of a possible dopant profile of the IGBT as illustrated in FIG. 3. A first peak 20 represents the dopant concentration of the p-doped zone 16, the second peak 21 represents the dopant concentration of the first field stop zone 17 that is produced by selenium implantation and subsequent laser annealing, and the third peak 22 represents the dopant concentration of the second field stop zone 18 that is produced by proton implantation.

Figure 5:
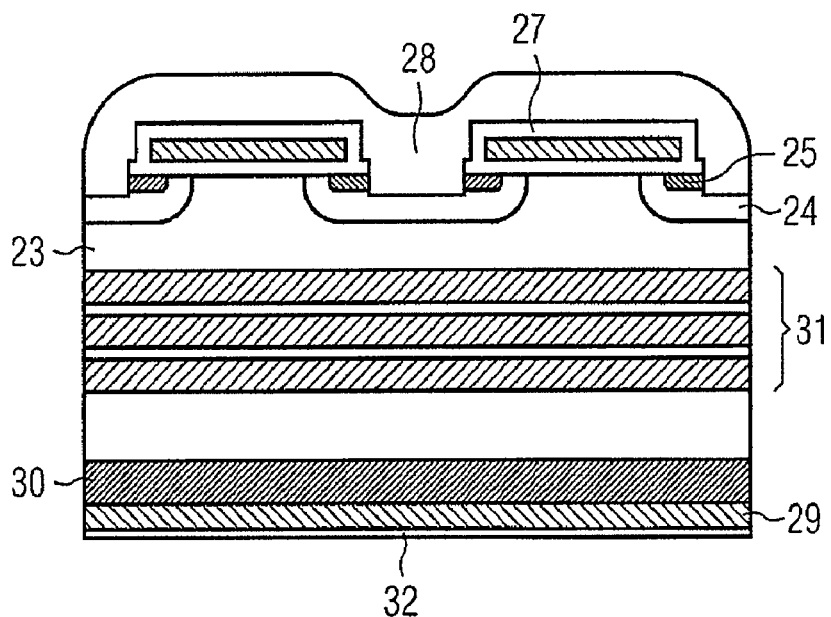
FIG. 5 illustrates a cross-sectional view of some embodiments of the invention comprising a first field stop zone adjacent to the p$^+$-zone and triple further or second field stop zones of different concentration.

FIG. 5 illustrates some embodiments of an IGBT comprising a semiconductor substrate 23, a base region 24 embedded in a top main surface of said substrate 23, and a source region 25 formed within said base region 24. A gate 26 that is embedded in an insulating silicon oxide layer 27 is formed above said base and source region 24 and 25, respectively. An electrode 28 is then formed over said top surface of said substrate 23 contacting said base and source region 24 and 25, respectively.

In some embodiments, a p-doped zone 29 is formed in said substrate 23 by boron implantation adjacent to a bottom main surface of said substrate 23, and a first field stop zone 30 is formed in said substrate 23 by selenium implantation adjacent to said p-doped zone 29. In some embodiments, three second field stop zones 31 of different dopant concentrations are formed between said first field stop zone 30 and said top main surface of said substrate 23 at different depths of penetration, for example, by proton implantation, at different energy levels. A metal electrode 32 is formed atop said bottom main surface of said substrate 23.

Figure 6:
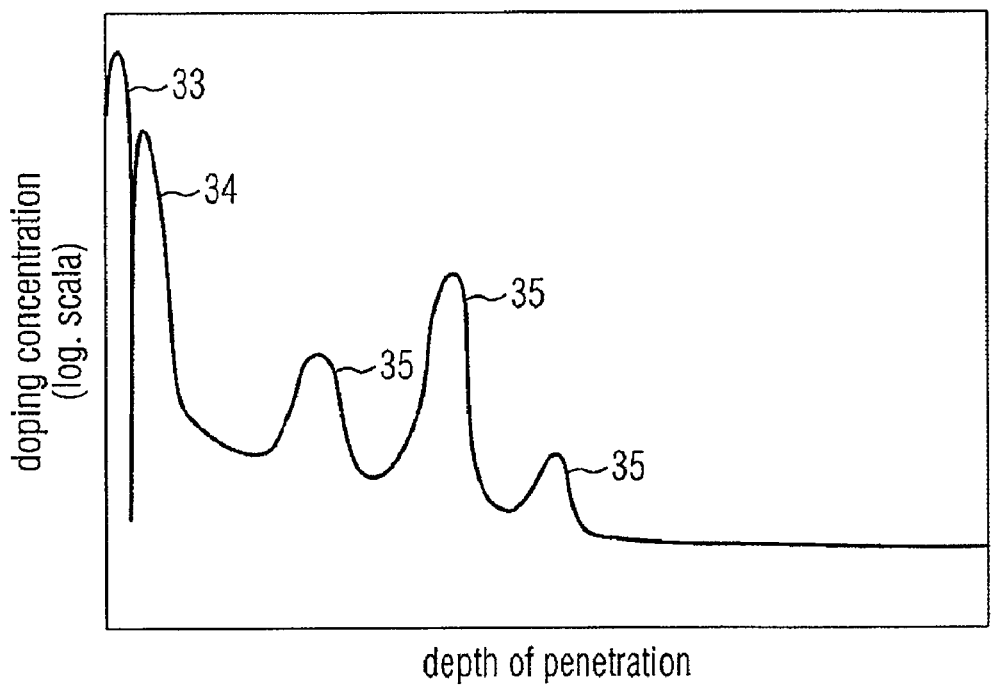
FIG. 6 illustrates some embodiments of a dopant profile of the IGBT embodiments shown in FIG. 5.

FIG. 6 shows a dopant profile of some embodiments of the IGBT illustrated in FIG. 5. A first peak 33 represents the dopant concentration of the p-doped zone 29, a second peak 34 represents the dopant concentration of the first field stop zone 30 that is produced by selenium implantation and subsequent laser annealing, and three subsequent peaks 35 represent the dopant concentration of the three second field stop zones 31 that are produced by proton implantation at different depths of penetration and subsequent thermal annealing at temperatures below 420° C.

Figure 7:
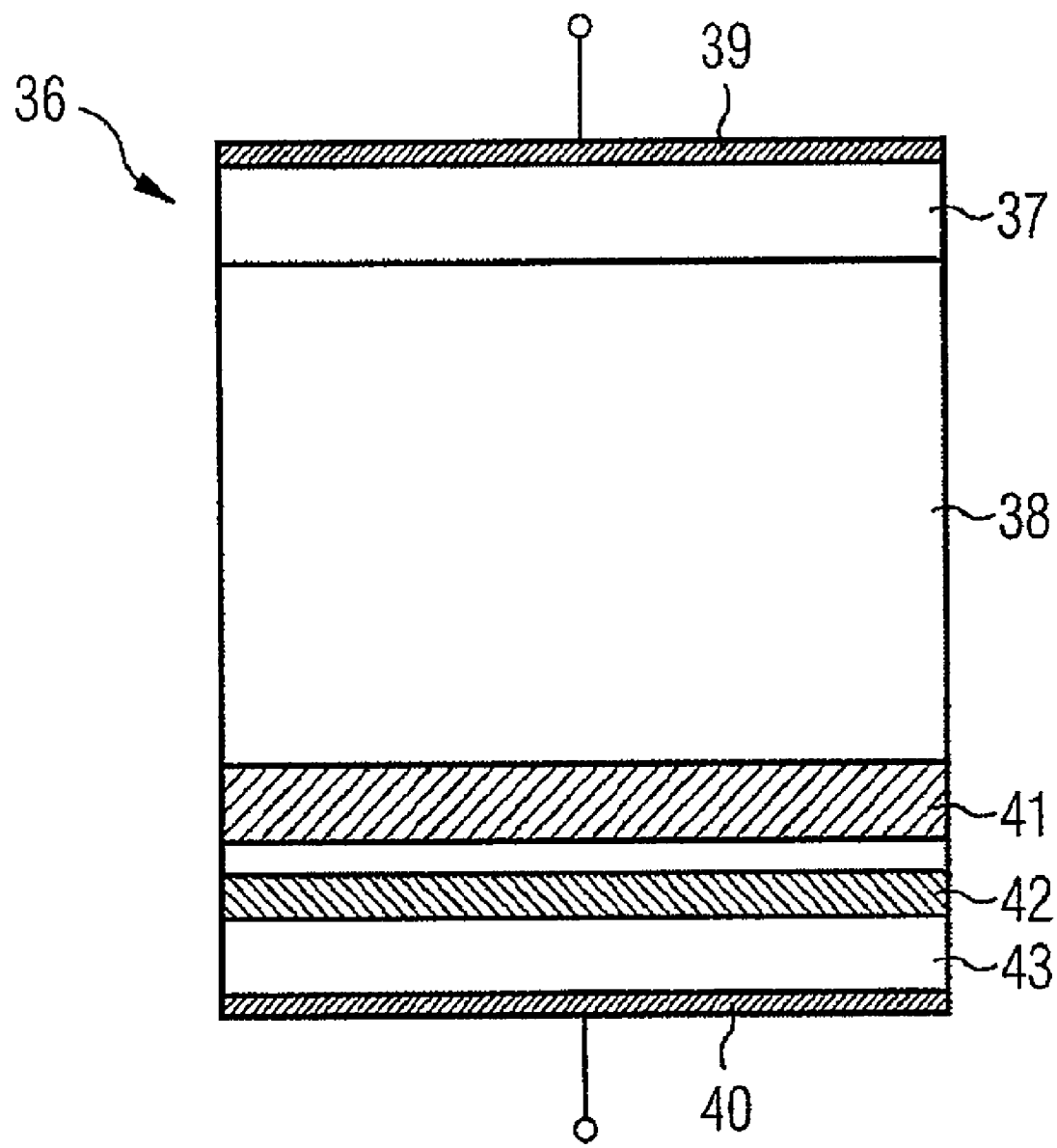
FIG. 7 illustrates an example of a semiconductor diode comprising field stop zones.

FIG. 7 schematically illustrates some embodiments of a semiconductor diode 36 comprising a first semiconductor layer 38 of n-type, a second semiconductor layer 37 of p-type conductivity and corresponding metal contacts 39 and 40 on a top and bottom main surface of said semiconductor layers 37 and 38. The semiconductor layer 38 further comprises a field stop zone 42 and—in some embodiments, as illustrated—a further field stop zone 41. The field stop zone 42 is produced e.g. by selenium implantation and laser annealing. An n$^+$ emitter zone 43 is provided in the second main surface of the substrate and produced, e.g. by phosphorus implantation and laser annealing. In some embodiments, the further field stop zone 41 is produced in a conventional manner, by means of proton implantation.

The field stop zones 42 and 41 reduce the tendency to current filamentation caused by thermomigration of the metal contacts 39, 40 of said semiconductor diode 36, which could lead for example to a distorted off-state characteristic curve of the semiconductor device.

The process is, in some embodiments, a process of producing a field stop zone within a semiconductor substrate comprising a first main surface and a second main surface, wherein the first main surface is for arranging electronic element structures therein and thereon and the second main surface is opposed to the first main surface, comprising the steps of implantation of dopant atoms through said second main surface, at least part of said dopant atoms having an energy level that is at least 0.15 eV below the energy level of the conduction band edge of said semiconductor, e.g. selenium or sulphur atoms, and annealing said field stop zone using laser annealing means and/or thermal annealing means.

In some embodiments of the process improved performance is attained by a process of manufacturing a semiconductor device comprising at least a first field stop zone of a first conductivity type defined by implanted first dopant atoms and a second field stop zone of the first conductivity type defined by implanted protons as second donator atoms, the process comprising: producing a metal layer pattern on a first main surface of a semiconductor substrate of said semiconductor device, producing said first field stop zone with a first dopant concentration by dopant implantation in said semiconductor substrate using said first dopant atoms, said first dopant atoms having an energy level that is at least 0.15 eV below the energy level of the conduction band edge of said semiconductor substrate, and annealing said first field stop zone using laser annealing means.

In some embodiments, the dopant atoms in the first field stop zone additionally comprise a further type of dopant atoms acting as shallow impurities like e.g. phosphorus atoms. Subsequently, for both aforementioned embodiments, the steps of producing a p$^+$-zone of a second conductivity type on a second main surface of said semiconductor substrate, the second main surface being opposed to the first main surface, producing said second field stop zone of said first conductivity type and a second dopant concentration by proton-implantation between said first field stop zone and said first main surface of said semiconductor substrate, annealing said second field stop zone using thermal annealing means, and forming a backside metallization connected to and across said second main surface of said semiconductor substrate are carried out.

In some embodiments, the apparatus discussed is a semiconductor device comprising a semiconductor substrate of a first conductivity type comprising a first and second main surface, the second main surface being opposite to the first main surface; an MOS-structure formed in the semiconductor substrate adjacent to that first main surface, a metal layer pattern on said first main surface, a zone of a second conductivity type formed adjacent to said second main surface, a first field stop zone of said first conductivity type, defined by implanted first dopant atoms of a first dopant concentration and formed adjacent to said zone adjacent to said second main surface, at least part of said first dopant atoms having an energy level that is at least 0.15 eV below the energy level of the conduction band edge of said semiconductor substrate, a second field stop zone of a first conductivity type defined by implanted protons of said second dopant concentration and formed between said first field stop zone and said first main surface, and a backside metallization connected to and across said second main surface of said semiconductor substrate.

In addition, advantages of the present invention are attained by another embodiment of the invention which is a semiconductor diode, comprising a first semiconductor layer of a first conductivity type and a second semiconductor layer of a second conductivity type, and further comprising a first field stop zone of said first conductivity type defined by implanted dopant atoms having an energy level that is at least 0.15 eV below the energy level of the conduction band edge of said first semiconductor layer, whereby these implanted atoms are activated by laser annealing.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in several embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. A process of producing a field stop zone within a semiconductor substrate having semiconductor elements formed at a top main surface thereof,
    implanting dopant atoms into a bottom main surface of the substrate to form a field stop zone between a channel region and the bottom main surface of the substrate, at least some of the dopant atoms having energy levels of at least 0.15 eV below the energy level of the conduction band edge of semiconductor substrate;
    wherein implanting dopant atoms includes implanting other dopant atoms, which act as shallow impurities, in a further implantation zone, including selecting a dopant dose ratio between dopant atoms having an energy level that is at least 0.15 eV below the energy level of the conduction band edge and other dopant atoms which act as shallow impurities, to obtain an approximately temperature-independent softness during turn-off across the operating temperature range of a semiconductor device formed within said semiconductor substrate; and
    laser annealing said field stop zone.

2. The process according to claim 1, wherein said dopant atoms comprise selenium atoms.

3. The process according to claim 1, wherein said dopant atoms comprise sulphur atoms.

4. The process according to claim 1, wherein the other dopant atoms comprise phosphorus atoms.

5. The process according to claim 1, wherein the other dopant atoms comprise arsenic atoms.

6. The process according to claim 1, wherein the dopant dose ratio is in the range between about 0.15 and 0.8.

7. The process according to claim 1, comprising thermally annealing the further field stop zone.

8. The process according to claim 1, wherein a dopant dose of said field stop zone is greater than about $5\times10^{11}$ cm$^{-2}$.

9. The process according to claim 1, wherein implanting dopant atoms forms a field stop zone at a depth of penetration that is less than 1 µm from the surface of the substrate.

10. A process of manufacturing a semiconductor device, comprising:
    implanting a first dopant through a first surface in a semiconductor substrate using first dopant atoms, at least part of said first dopant atoms having an energy level that is at least 0.15 eV below the energy level of the conduction band edge of said semiconductor substrate to produce a first field stop zone of a first conductivity type with a first dopant concentration;
    performing at least one of laser annealing or thermal annealing of said first field stop zone;
    implanting a second dopant to produce a second field stop zone of said first conductivity type and a second dopant concentration by proton-implantation between said first field stop zone and a further surface of said semiconductor substrate, the further surface opposed to the first surface; and
    thermal annealing said second field stop zone;
    wherein prior to implanting the dopant in an initial step, forming a semiconductor device structure upon the further surface of said semiconductor substrate, and
    subsequent to annealing said second field stop zone, forming a backside metallization on the first substrate surface.

11. The process according to claim 10, wherein said thermal annealing is carried out at a temperature that is equal to or less than about 420° C.

12. The process according to claim 10, wherein said first field stop zone is produced by implantation of selenium atoms.

13. The process according to claim 10, wherein said first field stop zone is produced by implantation of sulphur atoms.

14. A process of manufacturing a semiconductor device, comprising:
    implanting a first dopant through a first surface in a semiconductor substrate using first dopant atoms, at least art of said first dopant atoms having an energy level that is at least 0.15 eV below the energy level of the conduction band edge of said semiconductor substrate to produce a first field stop zone of a first conductivity type with a first dopant concentration;
    performing at least one of laser annealing or thermal annealing of said first field stop zone;
    implanting a second dopant to produce a second field stop zone of said first conductivity type and a second dopant concentration by proton-implantation between said first field stop zone and a further surface of said semiconductor substrate, the further surface opposed to the first surface; and
    thermal annealing said second field stop zone;
    wherein said the first dopant atoms are selenium or sulphur atoms, and the second dopant is phosphorus or arsenic atoms, and wherein the ratio between selenium or sulphur atoms, respectively, and phosphorus or arsenic atoms, respectively, is adjusted to be within a range between about 0.15 and 0.8.

15. The process according to claim 10, further comprising forming an emitter zone of the second conductivity type in the further surface by implantation of boron atoms.

16. A process of manufacturing a semiconductor device, comprising;

implanting a first dopant through a first surface in a semiconductor substrate using first dopant atoms, at least part of said first dopant atoms having an energy level that is at least 0.15 eV below the energy level of the conduction band edge of said semiconductor substrate to produce a first field stop zone of a first conductivity type with a first dopant concentration;

performing at least one of laser annealing or thermal annealing of said first field stop zone;

implanting a second dopant to produce a second field stop zone of said first conductivity type and a second dopant concentration by proton-implantation between said first field stop zone and a further surface of said semiconductor substrate, the further surface opposed to the first surface;

thermal annealing said second field stop zone; and laser annealing said emitter zone.

17. The process according to claim 10, wherein said first dopant dose of said first field stop zone is about at least $5 \times 10^{11}$ $cm^{-2}$.

18. The process according to claim 10, wherein implanting said first dopant forms said first field stop zone at a depth of penetration that is less than 1 μm with respect to said further surface.

* * * * *

UNITED STATES PATENT AND TRADEMARK OFFICE
CERTIFICATE OF CORRECTION

PATENT NO. : 8,343,862 B2  
APPLICATION NO. : 13/103784  
DATED : January 1, 2013  
INVENTOR(S) : Schulze et al.

Page 1 of 1

It is certified that error appears in the above-identified patent and that said Letters Patent is hereby corrected as shown below:

Title page, item (56) "Other Publications", line 1, after "11/468,846", insert --,--, therefor Title page, item (56) "Other Publications", line 14, after "Action", insert --mailed Feb. 4, 2010--, therefor Title page, item (56) "Other Publications", line 21, delete "filed" and insert --mailed--, therefor

Claims

In column 8, line 50, in Claim 14, delete "art" and insert --part--, therefor

In column 9, line 10, in Claim 16, delete "comprising;" and insert --comprising:--, therefor Signed and Sealed this  
Twenty-seventh Day of October, 2015

Michelle K. Lee  
*Director of the United States Patent and Trademark Office*